United States Patent
Li et al.

(10) Patent No.: US 11,535,117 B2
(45) Date of Patent: Dec. 27, 2022

(54) METHOD AND DEVICE FOR DETERMINING UTILITY OF REPLACEMENT OF BATTERY PACK FOR ELECTRIC VEHICLE

(71) Applicant: NIO (ANHUI) HOLDING CO., LTD., Hefei (CN)

(72) Inventors: Bin Li, Hong Kong (CN); Lihong Qin, Hong Kong (CN); Chendong Huang, Hong Kong (CN); Fei Shen, Hong Kong (CN); Xiaojia Deng, Hong Kong (CN)

(73) Assignee: NIO (ANHUI) HOLDING CO., LTD., Hefei (CN)

( * ) Notice: Subject to any disclaimer, the term of this patent is extended or adjusted under 35 U.S.C. 154(b) by 797 days.

(21) Appl. No.: 16/474,994

(22) PCT Filed: Dec. 4, 2017

(86) PCT No.: PCT/CN2017/114368
§ 371 (c)(1),
(2) Date: Jun. 28, 2019

(87) PCT Pub. No.: WO2018/121183
PCT Pub. Date: Jul. 5, 2018

(65) Prior Publication Data
US 2019/0329668 A1    Oct. 31, 2019

(30) Foreign Application Priority Data
Dec. 30, 2016    (CN) .......................... 201611271002.X

(51) Int. Cl.
*B60L 53/80*    (2019.01)
*G01R 31/382*    (2019.01)
(Continued)

(52) U.S. Cl.
CPC ............... *B60L 53/80* (2019.02); *B60L 50/60* (2019.02); *B60L 53/665* (2019.02); *B60L 58/10* (2019.02);
(Continued)

(58) Field of Classification Search
CPC ........ B60L 53/80; B60L 50/60; B60L 53/665; B60L 58/10; B60L 58/16; B60L 58/18;
(Continued)

(56) References Cited

U.S. PATENT DOCUMENTS

2015/0134546 A1*  5/2015  Penilla .................... B60L 53/68
705/305

FOREIGN PATENT DOCUMENTS

CN    101625398    1/2010
CN    102209904    10/2011
(Continued)

OTHER PUBLICATIONS

Extended Search Report for European Patent Application No. 17887271.9, dated Jun. 5, 2020, 9 pages.
(Continued)

*Primary Examiner* — Paul Dinh
(74) *Attorney, Agent, or Firm* — Sheridan Ross P.C.

(57) ABSTRACT

Provided are a method and device for estimating the utility of replacement of a battery pack for an electric vehicle, and a charging management method and system based on the method and device. The method comprises the following steps: acquiring state data associated with a first battery pack and a second battery pack, the state data comprising usage history of the first battery pack and performance parameters of the first battery pack and the second battery pack; and determining a utility value according to the state data, wherein the utility value is used to characterize a degree of impact of an operation of replacing the first battery pack
(Continued)

with the second battery pack on the service efficiency and service life of a battery pack set to which the first battery pack and the second battery pack belong. The method facilitates improving the service efficiency of a managed battery in a battery swap mode and extending the overall service life thereof.

18 Claims, 2 Drawing Sheets

(51) Int. Cl.
    *B60L 53/66* (2019.01)
    *B60L 58/10* (2019.01)
    *G01R 31/36* (2020.01)
    *G06Q 10/00* (2012.01)
    *B60L 50/60* (2019.01)

(52) U.S. Cl.
    CPC ....... *G01R 31/3648* (2013.01); *G01R 31/382* (2019.01); *G06Q 10/20* (2013.01)

(58) Field of Classification Search
    CPC .. G01R 31/3648; G01R 31/382; G06Q 10/20; Y02T 10/70; Y02T 10/7072; Y02T 90/12; Y02T 90/16
    USPC .......................................... 320/109; 705/305
    See application file for complete search history.

(56) References Cited

FOREIGN PATENT DOCUMENTS

| | | |
|---|---|---|
| CN | 102358202 | 2/2012 |
| CN | 104614681 | 5/2015 |
| CN | 105206887 | 10/2015 |
| CN | 105584438 | 5/2016 |
| EP | 2940780 | 11/2015 |
| JP | 2013-077054 | 4/2013 |
| JP | 2015-027223 | 2/2015 |
| WO | WO 2015/001930 | 1/2015 |

OTHER PUBLICATIONS

International Search Report for International (PCT) Patent Application No. PCT/CN2017/114368, dated Feb. 23, 2018, 2 pages.
Official Action for European Patent Application No. 17887271.9, dated May 6, 2021, 7 pages.
Official Action for China Patent Application No. 201611271002.X, dated Jul. 22, 2020, 7 pages.

\* cited by examiner

METHOD AND DEVICE FOR DETERMINING UTILITY OF REPLACEMENT OF BATTERY PACK FOR ELECTRIC VEHICLE

CROSS REFERENCE TO RELATED APPLICATIONS

This application is a national stage application under 35 U.S.C. 371 and claims the benefit of PCT Application No. PCT/CN2017/114368, having an international filing date of 04 Dec. 2017, which designated the United States, which PCT application claimed the benefit of China Patent Application No. 201611271002.X filed 30 Dec. 2016, the disclosure of each of which are incorporated herein by reference.

TECHNICAL FIELD

The present invention relates to the technology of new energy vehicles, and in particular to a method and device for estimating the utility of replacement of a battery pack for an electric vehicle and a charging management method and system based on the method and device.

BACKGROUND ART

In order to significantly reduce the emission of carbon dioxide from vehicles, the vehicle industry is investing a large number of human and material resources in the research and development of novel vehicles using electric power as a power source, for example, hybrid electric vehicles and battery electric vehicles. A battery electric vehicle is a vehicle that is powered by an onboard battery, uses an electric motor to drive wheels, and conforms to various requirements of laws and regulations concerning roads, traffic, and safety. Due to less influence on the environment compared to traditional vehicles, the battery electric vehicles have a bright prospect.

However, there are still many difficulties in the popularization and promotion of battery electric vehicles on the market. For example, one major problem is supplying power to traction batteries. Specifically, batteries are used to store electrical energy in novel vehicles. In consideration of safety, costs, and service life, batteries in currently developed electric vehicles have relatively low energy density, and as a result the range provided per charge is limited for the electric vehicles.

A charging mode and a battery swap mode are generally used to supply power to traction batteries of battery electric vehicles. A disadvantage of the charging mode is mainly undesirable user experience caused by a long charging time. The battery swap mode is operated to resolve a series of problems such as short ranges, difficult charging, and high costs of electric vehicles, and therefore it is the mode with better technologies and market prospects. In the battery swap mode, a charging operator is responsible for jointly manage traction batteries, and a user leases a traction battery from a charging station operator to obtain a charging service. Although the battery swap mode helps to reduce operation costs and improve user experience, an operator is facing an arduous task of figuring out how to improve the service efficiency of batteries and extend the overall service life thereof when managing an enormous number of batteries, especially when a charging behavior of users is highly random and unpredictable.

SUMMARY OF THE INVENTION

An objective of the present invention is to provide a method for estimating the utility of replacement of a battery pack for an electric vehicle, which facilitates improving the service efficiency of a managed battery in a battery swap mode and extending the overall service life thereof.

The method for estimating the utility of replacement of a battery pack for an electric vehicle according to an aspect of the present invention comprises the following steps:

acquiring state data associated with a first battery pack and a second battery pack, the state data comprising usage history of the first battery pack and performance parameters of the first battery pack and the second battery pack; and determining a utility value according to the state data, wherein the utility value is used to characterize a degree of impact of an operation of replacing the first battery pack with the second battery pack on the service efficiency and service life of a battery pack set to which the first battery pack and the second battery pack belong.

Preferably, in the method, the state data comprises performance parameters of the first battery pack and the second battery pack and usage history of the first battery pack.

Preferably, in the method, the performance parameters of the first battery pack and the second battery pack comprise current energy storage values of the first battery pack and the second battery pack and a range factor and a power factor of the second battery pack, the range factor increases as the maximum driving range of the second battery pack increases, the power factor increases as the maximum discharging power of the second battery pack increases, and the utility value increases as the difference between the current energy storage values of the first battery pack and the second battery pack, the range factor, and the power factor increase.

Preferably, in the method, the usage history of the first battery pack is a time loss factor and a range loss factor, the time loss factor increases as an accumulated usage time since the first battery pack is put to use for the last time increases, the range loss factor increases as an accumulated driving range since the first battery pack is put to use for the last time increases, and the utility value decreases as the time loss factor and the range loss factor increase.

Preferably, in the method, if a condition

Max $(E_1, E_2, E_{Average})$–Min $(E_1, E_2, E_{Average})/E_{Average} \geq \lambda$ is satisfied, the difference $\Delta E$ between the current energy storage values of the first battery pack and the second battery pack is determined in the following manner:

$$\Delta E = (E_{new} - E_{used})/E_{Average}$$

where $E_1$ is the maximum energy storage value of a new battery pack, $E_2$ is the maximum energy storage value of a used battery pack, $E_{Average}$ is an average value of maximum energy storage values of battery packs in a battery pack set to which the new battery pack and the used battery pack belong, $\lambda$ is a constant that can be experimentally determined, $E_{used}$ is a current energy storage value of the used battery pack, and $E_{new}$ is a current energy storage value of the new battery pack.

Preferably, in the method, if a condition

Max $(E_1, E_2, E_{Average})$–Min $(E_1, E_2, E_{Average})/E_{Average} < \lambda$ is satisfied, the difference $\Delta E$ between the current energy storage values of the first battery pack and the second battery pack is determined in the following manner:

$$\Delta E = SOC_{new} - SOC_{used}$$

where $E_1$ is the maximum energy storage value of a new battery pack, $E_2$ is the maximum energy storage value of a used battery pack, $E_{Average}$ is an average value of maximum energy storage values of battery packs in a battery pack set to which the new battery pack and the used battery pack belong $\lambda$ is a constant that can be experimentally determined, $SOC_{new}$ is a state of charge (SOC) of the new battery pack, and $SOC_{used}$ is an SOC of the used battery pack.

Preferably, in the method, the utility value F is determined in the following manner:

$$F = \Delta E \times Fr \times Fp / (Dt \times Dr)$$

where ΔE is the difference between the current energy storage values of the first battery pack and the second battery pack, Fr is the range factor of the second battery pack, Fp is the power factor of the second battery pack, Dt is the time loss factor of the first battery pack, and Dr is the range loss factor of the first battery pack.

Another objective of the present invention is to provide a charging management method, which facilitates improving the service efficiency of a managed battery in a battery swap mode and extending the overall service life thereof.

The charging management method according to another aspect of the present invention comprises the following steps:

performing the method for estimating the utility of replacement of a battery pack for an electric vehicle; and correcting, by using the utility value, the charging for replacement of the first battery pack with the second battery pack.

Preferably, in the charging management method, the charging for replacement of the first battery pack with the second battery pack is corrected in the following manner:

$$Ps = Pb \times F$$

where Pb is a basic amount that needs to be charged or basic points that need to be deducted for replacement of the first battery pack with the second battery pack, and Ps is a corrected value of the basic amount that needs to be charged or the basic points that need to be deducted for replacement of the first battery pack with the second battery pack.

Preferably, in the charging management method, the charging for replacement of the first battery pack with the second battery pack is corrected in the following manner:

$$Ps = Pb \times F + Ph + Pl$$

where Pb is a basic amount that needs to be charged or basic points that need to be deducted for replacement of the first battery pack with the second battery pack, Ps is a corrected value of the basic amount that needs to be charged or the basic points that need to be deducted for replacement of the first battery pack with the second battery pack, Ph is a weighted value for human interference by which the first battery pack is replaced with the second battery pack, and Pl is a weighted value for a location where the first battery pack is replaced with the second battery pack.

A still further objective of the present invention is to provide a device for estimating the utility of replacement of a battery pack for an electric vehicle, which facilitates improving the service efficiency of a managed battery in a battery swap mode and extending the overall service life thereof.

The device for estimating the utility of replacement of a battery pack for an electric vehicle according to another aspect of the present invention comprises:

a memory configured to store state data associated with a first battery pack and a second battery pack, the state data comprising usage history of the first battery pack and performance parameters of the first battery pack and the second battery pack; and a processor configured to determine a utility value according to the state data, wherein the utility value is used to characterize a degree of impact of an operation of replacing the first battery pack with the second battery pack on the service efficiency and service life of a battery pack set to which the first battery pack and the second battery pack belong.

A still further objective of the present invention is to provide a charging management system, which facilitates improving the service efficiency of a managed battery in a battery swap mode and extending the overall service life thereof.

The charging management system according to another aspect of the present invention comprises:

the device for estimating the utility of replacement of a battery pack for an electric vehicle; and a user management module coupled to the device, wherein the user management module is configured to correct, by using the utility value, the charging for an operation of replacing the first battery pack with the second battery pack.

BRIEF DESCRIPTION OF THE DRAWINGS

The foregoing and/or other aspects and advantages of the present invention will be clearer and more comprehensible from the following description of various aspects with reference to the accompanying drawings, and the same or similar units in the accompanying drawings are represented by the same numerals. The accompanying drawings comprise.

DETAILED DESCRIPTION OF EMBODIMENTS

The present invention is described below more comprehensively with reference to the accompanying drawings showing schematic embodiments of the present invention. However, the present invention may be implemented in different forms but should be construed as being only limited to the embodiments herein. The embodiments provided in foregoing are only intended to make the disclosure of this specification comprehensive and complete, so as to convey the protection scope of the present invention to a person skilled in the art more comprehensively.

In this specification, the terms such as "comprise" and "comprise" indicate that in addition to the units and steps that are directly and clearly described in the specification and claims, other units and steps that are not directly or clearly described are not excluded in the technical solutions of the present invention.

The terms such as "first" and "second" are not used to indicate sequences of units in terms of time, space, size, and the like, and are only used to distinguish between the units.

"Coupled" should be construed comprising a case in which electrical energy or electrical signals are directly transferred between two units or a case in which electrical energy or electrical signals are indirectly transferred via one or more third units.

According to one aspect of the present invention, for replacement of a pair of battery packs in one battery pack set, a utility value generated by a replacement operation of the pair of battery packs is determined. That is, a degree of impact of a battery pack replacement operation on the overall service life and the service efficiency of the battery pack set is determined. For example, the utility value may be used to determine the time to recommend battery replacement to a user, calculate a fee for a battery replacement operation, and measuring operation costs of a charging station.

It should be noted that the battery pack set should be understood extensively. For example, the battery pack set comprises, but is not limited to, all battery packs managed by a charging station operator or a subset of the battery packs. The subset may be a plurality of battery packs that have at least one same or similar attribute in the following: a geographical area of a charging station, a battery manufacturer, a battery pack production batch number, and a vehicle model.

According to another aspect of the present invention, a utility value is determined based on a state data associated with the pair of battery packs. Preferably, the state data comprising usage history and a performance parameter of a battery pack that is to be removed from a vehicle (which is also referred to as a "first battery pack" or an "used battery pack" below) and a performance parameter of a battery pack that is to be installed on the vehicle (which is also referred to as a "second battery pack" or a "new battery pack" below).

Figure 1:
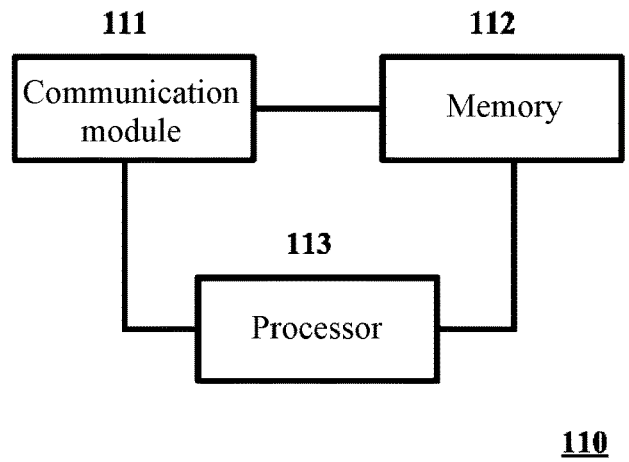
FIG. 1 is a schematic block diagram of a device for dealing with security loophole information in a payment system according to an embodiment of the present invention.

FIG. 1 is a schematic block diagram of a device for estimating the utility of replacement of a battery pack for an electric vehicle according to an embodiment of the present invention. The device 110 shown in FIG. 1 comprises a communication module 111, a memory 112, and a processor 113.

The communication module 111 is configured to communicate with an external apparatus, for example, receive state data of a vehicle from the vehicle, send battery replacement recommend information to the vehicle, and send a utility value of a battery replacement operation to a charging management system. The memory 112 is coupled to the communication module 111, and is configured to store state data associated with battery packs related to a replacement operation, for example, usage history and a performance parameter of the used battery pack and a performance parameter of the new battery pack. The processor 112 is coupled to the communication module 111 and the memory 113, and is configured to determine the utility value of the replacement operation according to the state data stored in the memory 112.

In this embodiment, preferably, current energy storage values of the new battery pack and the used battery pack and a range factor and a power factor of the new battery pack are used to characterize performance of the battery packs, and a time loss factor and a range loss factor of the used battery pack are used to characterize the usage history of the used battery pack.

The range factor is a parameter related to the maximum driving range of the new battery pack, and increases as the maximum driving range increases (for example, the range factor is directly proportional to the maximum driving range). In this embodiment, preferably, the range factor may be defined as a ratio of the maximum driving range of the new battery pack to a reference maximum driving range. The reference maximum driving range may be one value in the following group: an average maximum driving range of all the battery packs or battery packs in an unused state in a battery pack set, a median of maximum driving ranges of all the battery packs or the battery packs in an unused state in the battery pack set, and a most possible maximum driving range of all the battery packs or the battery packs in an unused state in the battery pack set (for example, if among the battery packs in an unused state, battery packs of which maximum driving ranges are a kilometers account for the largest proportion in the battery pack set, a kilometers may be used as the most possible maximum driving range).

The power factor is a parameter related to the maximum discharging power of the new battery pack, and increases as the maximum discharging power of the new battery pack increases (for example, the power factor is directly proportional to the maximum discharging power). In this embodiment, preferably, the power factor may be defined as a ratio of the maximum discharging power of the new battery pack to a reference maximum discharging power. The reference maximum discharging power may be one value in the following group: an average maximum discharging power of all the battery packs or the battery packs in an unused state in the battery pack set, a median of maximum discharging powers of all the battery packs or the battery packs in an unused state in the battery pack set, and a most possible maximum discharging power of all the battery packs or the battery packs in an unused state in the battery pack set (for example, if among the battery packs in an unused state, battery packs of which maximum discharging power is P kilowatts account for the largest proportion in the battery pack set, P kilowatts may be used as the most possible maximum discharging power).

The time loss factor is a parameter related to an accumulated usage time since the used battery pack is put to use for the last time, and increases as the accumulated usage time increases (for example, the time loss factor is directly proportional to the accumulated usage time). Preferably, the time loss factor may be defined as a ratio of the accumulated usage time of the used battery pack to a reference accumulated usage time. The reference accumulated usage time may be specially set for each user (for example, based on a driving habit of the user, a membership grade of the user, and the like).

The range loss factor is a parameter related to an accumulated driving range since the used battery pack is put to use for the last time, and increases as the accumulation driving range increases (for example, the range loss factor is directly proportional to the accumulated driving range). Preferably, the range loss factor may be defined as a ratio of the accumulated driving range of the used battery pack to a reference driving range. The reference accumulated usage time may be specially set for each user (for example, based on a driving habit of the user, a membership grade of the user, and the like).

A relatively large difference between the current energy storage values of the new battery pack and the used battery pack and a relatively large time loss factor and range loss factor of the battery pack may be significantly attributed to full use of the used battery pack, but may also indicate that the used battery pack is in a deeply discharged state, causing adverse impact on service life of a battery. As can be seen, the introduction of a difference between energy storage values and the time loss factor and the range loss factor to determine the utility value may reflect a degree of impact of a replacement operation of the new battery pack and the used battery pack on both the service efficiency and service life of the battery pack set to which the new battery pack and the used battery pack belong.

In addition, a relatively large range factor and power factor indicate that a new battery pack has relatively high performance, appropriately increased use of such a battery pack helps to extend the overall service life of a battery pack set. However, in another aspect, if battery packs having high performance are intensively used and battery packs having poor performance are left idle, the service efficiency of the battery pack set is affected. As can be seen, the introduction of a range factor and a power factor to determine the utility value may also reflect a degree of impact of a replacement operation of the new battery pack and the used battery pack on both the service efficiency and service life of the battery pack set to which the new battery pack and the used battery pack belong.

As can be seen from the foregoing discussion, improvement of the service efficiency and extension of service life of the battery pack set are usually two conflicting objectives. In this embodiment, to reach a balance between the service efficiency and service life of the battery pack set to obtain optimal or second optimal overall benefit, the relationship between the utility value and the foregoing performance parameters and usage history may be defined as that the utility value increases as the difference between the current energy storage values of the new battery pack and the used battery pack and the range factor and the power factor of the new battery pack increase and decreases as the time loss factor and the range loss factor of the used battery pack increases.

In this embodiment, preferably, the processor 113 may be configured to determine the utility value F in the following manner:

$$F = \Delta E \times Fr \times Fp / (Dt \times Dr) \quad (1)$$

where $\Delta E$ is the difference between the current energy storage values of the used battery pack and the new battery pack, Fr is the range factor of the new battery pack, Fp is the power factor of the new battery pack, Dt is the time loss factor of the used battery pack, and Dr is the range loss factor of the used battery pack.

In this embodiment, preferably, the processor 130 may be configured to determine the difference $\Delta E$ between the current energy storage values of the new battery pack and the used battery pack in different manners according to a preset condition. For example, when a condition shown in Formula (2) is satisfied, the processor 130 determines the difference $\Delta E$ between the energy storage values in the manner shown in Formula (3):

$$\mathrm{Max}(E_1, E_2, E_{Average}) - \mathrm{Min}(E_1, E_2, E_{Average}) / E_{Average} \geq \lambda \quad (2)$$

$$\Delta E = (E_{new} - E_{used}) / E_{Average} \quad (3)$$

where $E_1$ is the maximum energy storage value of the new battery pack, $E_2$ is the maximum energy storage value of the used battery pack, $E_{Average}$ is an average value of maximum energy storage values of battery packs in the battery pack set to which the new battery pack and the used battery pack belong, Max represents the maximum value of $E_1$, $E_2$, and $E_{Average}$, and Min represents the minimum value of $E_1$, $E_2$, and $E_{Average}$, $\lambda$ is a constant that can be experimentally determined (for example, the value thereof may be in the range of 10% to 15%, and the range contains endpoint values), $E_{used}$ is the current energy storage value of the used battery pack, and $E_{new}$ is the current energy storage value of the new battery pack.

In another aspect, when a condition shown in Formula (4) is satisfied, the processor 130 determines the difference $\Delta E$ between the energy storage values in the manner shown in Formula (5):

$$\mathrm{Max}(E_1, E_2, E_{Average}) - \mathrm{Min}(E_1, E_2, E_{Average}) / E_{Average} < \lambda \quad (4)$$

$$\Delta E = SOC_{new} - SOC_{used} \quad (5)$$

where $E_1$ is the maximum energy storage value of the new battery pack, $E_2$ is the maximum energy storage value of the used battery pack, $E_{Average}$ is an average value of maximum energy storage values of battery packs in the battery pack set to which the new battery pack and the used battery pack belong, Max represents the maximum value of $E_1$, $E_2$, and $E_{Average}$, Min represents the minimum value of $E_1$, $E_2$, and $E_{Average}$, is a constant that can be experimentally determined (for example, the value thereof may be in the range of 10% to 15%, and the range contains endpoint values), $SOC_{new}$ is an SOC of the new battery pack, and $SOC_{used}$ is an SOC of the used battery pack.

Figure 2:
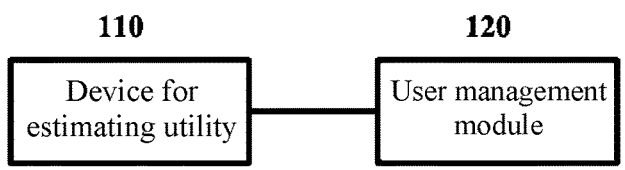
FIG. 2 is a schematic block diagram of a charging management system according to another embodiment of the present invention.

FIG. 2 is a schematic block diagram of a charging management system according to another embodiment of the present invention. The charging management system 10 shown in FIG. 2 comprises a device 110 for estimating the utility of replacement of a battery pack for an electric vehicle and a user management module 120 coupled to the device 110. The foregoing form of the embodiment described by using FIG. 1 may be used for the device 110, and details are not described herein again.

In this embodiment, the user management module 120 is configured to perform a plurality of application tasks based on the utility value determined by the device 110. Examples of these tasks comprise, but are not limited to, determining the timing to recommend battery replacement to a user, calculating a fee for a battery replacement operation, designing a user charging bonus plan, and measuring operation costs of a charging station.

In this embodiment, the user management module may correct the charging for the battery replacement operation by using the utility value. Preferably, the user management module 120 is configured to correct the charging for replacement of the used battery pack with the new battery pack in the following manner:

$$Ps = Pb \times F \quad (6)$$

where Pb is a basic amount that needs to be charged or basic points that need to be deducted for replacement of the used battery pack with the new battery pack, and Ps is a corrected value of the basic amount or the deducted basic points.

In this embodiment, more factors may be considered to correct the charge, thereby further improving the service efficiency of a managed battery in a battery swap mode and extend the overall service life of the battery. For example, preferably, the user management module 120 may be configured to determine and correct the charging for replacement of the used battery pack with the new battery pack in the following manner:

$$Ps = Pb \times F + Ph + Pl \quad (7)$$

where Pb is a basic amount that needs to be charged or basic points that need to be deducted for the replacement of the used battery pack with the new battery pack, Ps is a corrected value of the basic amount or the deducted basic points, Ph is a weighted value for human interference by which the used battery pack is replaced with the new battery pack, and Pl is a weighted value for a location where the used battery pack is replaced with the new battery pack.

The values of Ph and Pl may be set in the following manner. For example, if a user replaces a battery pack independently at a fully automated charging station, Ph may be set to zero. If a service worker is needed to provide a battery pack replacement service, different Ph values may be set according to the property and time of a manual service. For another example, the value of Pl is zero by default. However, for a charging station at a hotspot area (for example, a large mall, a highway service area, and a transportation hub), a corresponding weight value may be set according to a factor such as busy levels and time segments.

Figure 3:
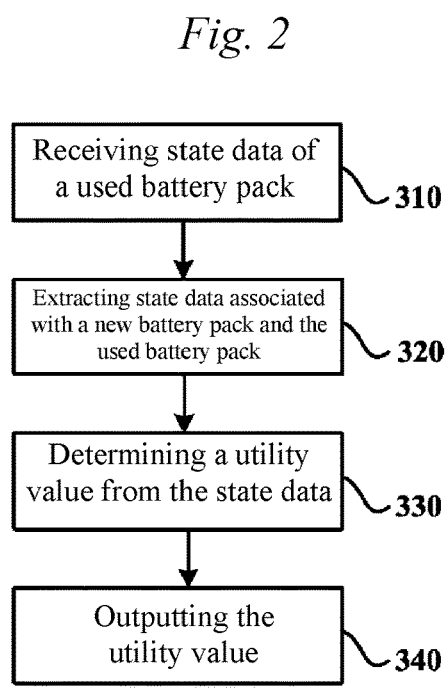
FIG. 3 is a flowchart of a method for estimating the utility of replacement of a battery pack for an electric vehicle according to another embodiment of the present invention.

FIG. 3 is a flowchart of a method for estimating the utility of replacement of a battery pack for an electric vehicle according to another embodiment of the present invention. For convenient description, this embodiment is implemented by using the foregoing device for estimating the utility of replacement of a battery pack for an electric vehicle shown in FIG. 1. However, it should be noted that the method in this embodiment does not rely on a device having a specific structure.

As shown in FIG. 3, in step 310, the communication module 111 receives the state data of the used battery pack from the vehicle and stores the state data in the memory 112.

Subsequently, in step 320, the processor 113 extracts state data associated with the new battery pack and the used battery pack from the memory 112. The meanings and properties of the state data have been thoroughly described above by using the embodiment shown in FIG. 1, and details are not described herein again.

Next, in step 330, the processor 113 determines the utility value according to the extracted state data. A specific manner of determining the utility value has been thoroughly described above by using the embodiment shown in FIG. 1, and details are not described herein again.

Finally, in step 340, the communication module 111 outputs the utility value determined by the processor 113 to an external device.

Figure 4:
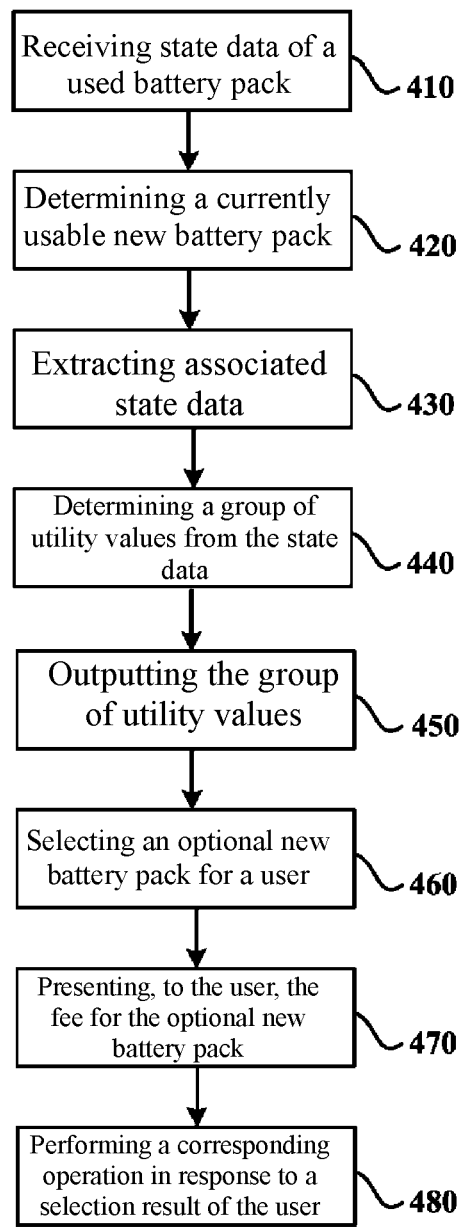
FIG. 4 is a flowchart of a charging management method according to another embodiment of the present invention.

FIG. 4 is a flowchart of a charging management method according to another embodiment of the present invention. For example, the application scenario assumed here is performing a task of charging a battery replacement operation. For convenient description, the method in this embodiment is implemented by using the foregoing charging management system shown in FIG. 2. However, it should be noted that the method in this embodiment does not rely on a charging management system having a specific structure.

As shown in FIG. 4, in step 410, the user management module 120 instructs, in response to a battery replacement request from a user, the communication module 111 in the device 110 to receive, from a vehicle of the user, state data of a battery on the vehicle, and store the state data in the memory 112.

Subsequently, in step 420, the user management module 120 determines currently usable new battery packs. In this embodiment, the currently usable new battery packs may be all usable new battery packs in one or more charging stations or some usable new battery packs in one or more charging stations. The currently usable new battery packs may be determined based on a plurality of factors. The factors comprise, but are not limited to, a battery manufacturer, a production batch number, and a user membership grade.

Next, in step 430, the processor 113 extracts state data associated with the used battery pack and the usable new battery packs from the memory 112. The meanings and properties of the state data have been thoroughly described above by using the embodiment shown in FIG. 1, and details are not described herein again.

Subsequently, in step 440, for each of the usable new battery packs, the processor 113 determines a utility value of replacement of the used battery pack with the new battery pack according to the extracted state data, so as to obtain a group of utility values. A specific manner of determining the utility value has been thoroughly described above by using the embodiment shown in FIG. 1, and details are not described herein again.

Next, step 450 is performed, the communication module 111 outputs, to the user management module 120, the group of utility values determined by the processor 113.

Subsequently, in step 460, the user management module 120 selects one or more optional new battery packs for the user according to the group of utility values, and calculates fees for replacement of the used battery pack with the optional new battery packs. A specific manner of determining a fee has been thoroughly described above by using the embodiment shown in FIG. 2, and details are not described herein again. In this step, the user management module 120 may determine the optional new battery packs in various manners, for example, make choices according to battery replacement preference, fee sensitivity, and the like of the user.

Next, in step 470, the user management module 120 presents fees corresponding to the optional new battery packs to the user.

Subsequently, in step 480, the user management module 120 performs a corresponding operation in response to a selection result of the user. For example, if the user selects one of the optional new battery packs, before or after battery pack replacement is completed, the user management module deducts, from an account of the user, an amount or points corresponding to the fee determined in step 460; or, if the user makes no selection, the user management module ends a current battery replace service.

The embodiments and examples proposed herein are provided to describe as adequately as possible embodiments according to the technology and specific applications thereof and enable a person skilled in the art to implement and use the present invention. However, a person skilled in the art will know that the foregoing descriptions and examples are provided only for description and illustration. The proposed description is not intended to cover all aspects of the present invention or limit the present invention to the disclosed precise forms.

In view of the above, the scope of the present disclosure is defined by the following claims.

What is claimed is:

1. A method for estimating a utility of replacement of a battery pack for an electric vehicle, comprising the following steps:
   acquiring state data associated with a first battery pack and a second battery pack, the state data comprises usage history of the first battery pack and performance parameters of the first battery pack and the second battery pack; and
   determining a utility value according to the state data, wherein the utility value is used to characterize an impact degree for replacing the first battery pack with the second battery pack on service efficiency and service life of a battery pack set to which the first battery pack and the second battery pack belong,
   wherein the performance parameters of the first battery pack and the second battery pack comprise current energy storage values of the first battery pack and the second battery pack and a range factor and a power factor of the second battery pack, the range factor increases as the maximum driving range of the second battery pack increases, the power factor increases as the maximum discharging power of the second battery pack increases, and the utility value increases as a difference between the current energy storage values of the first battery pack and the second battery pack, the range factor, and the power factor increase.

2. The method according to claim 1, wherein the usage history of the first battery pack is a time loss factor and a range loss factor, the time loss factor increases as an accumulated usage time from the first battery pack is put to use for the last time increases, the range loss factor increases as an accumulated driving range from the first battery pack is put to use for the last time increases, and the utility value decreases as the time loss factor and the range loss factor increase.

3. A charging management method, comprising the following steps:
performing the method according to claim 2; and
correcting, by using the utility value, the charging for replacement of the first battery pack with the second battery pack.

4. The method according to claim 1, wherein if a condition Max $(E_1, E_2, E_{Average})$–Min $(E_1, E_2, E_{Average})/E_{Average} \geq \lambda$ is satisfied, a difference $\Delta E$ between the current energy storage values of the first battery pack and the second battery pack is determined in the following manner:

$$\Delta E=(E_{new}-E_{used})/E_{Average}$$

where $E_1$ is the maximum energy storage value of a new battery pack, $E_2$ is the maximum energy storage value of a used battery pack, $E_{Average}$ is an average value of maximum energy storage values of battery packs in a battery pack set to which the new battery pack and the used battery pack belong, $\lambda$ is a constant that can be experimentally determined, $E_{used}$ is a current energy storage value of the used battery pack, and $E_{new}$ is a current energy storage value of the new battery pack.

5. The method according to claim 1, wherein if a condition Max $(E_1, E_2, E_{Average})$–Min $(E_1, E_2, E_{Average})/E_{Average} < \lambda$ is satisfied, a difference $\Delta E$ between the current energy storage values of the first battery pack and the second battery pack is determined in the following manner:

$$\Delta E=SOC_{new}-SOC_{used}$$

where $E_1$ is the maximum energy storage value of a new battery pack, $E_2$ is the maximum energy storage value of a used battery pack, $E_{Average}$ is an average value of maximum energy storage values of battery packs in a battery pack set to which the new battery pack and the used battery pack belong, $\lambda$ is a constant that can be experimentally determined, $SOC_{new}$ is an SOC of the new battery pack, and $SOC_{used}$ is an SOC of the used battery pack.

6. The method according to claim 1, wherein a utility value F is determined in the following manner:

$$F=\Delta E \times Fr \times Fp/(Dt \times Dr)$$

where $\Delta E$ is a difference between the current energy storage values of the first battery pack and the second battery pack, Fr is the range factor of the second battery pack, Fp is the power factor of the second battery pack, Dt is a time loss factor of the first battery pack, and Dr is a range loss factor of the first battery pack.

7. A charging management method, comprising the following steps:
performing the method according to claim 1; and
correcting, by using the utility value, the charging for replacement of the first battery pack with the second battery pack.

8. The charging management method according to claim 7, wherein the charging for replacement of the first battery pack with the second battery pack is corrected in the following manner:

$$Ps=Pb \times F$$

where Pb is a basic amount that needs to be charged or basic points that need to be deducted for replacement of the first battery pack with the second battery pack, and Ps is a corrected value of the basic amount that needs to be charged or the basic points that need to be deducted for replacement of the first battery pack with the second battery pack.

9. The charging management method according to claim 7, wherein the charging for replacement of the first battery pack with the second battery pack is corrected in the following manner:

$$Ps=Pb \times F+Ph+Pl$$

where Pb is a basic amount that needs to be charged or basic points that need to be deducted for replacement of the first battery pack with the second battery pack, Ps is a corrected value of the basic amount that needs to be charged or the basic points that need to be deducted for replacement of the first battery pack with the second battery pack, Ph is a weighted value for human interference by which the first battery pack is replaced with the second battery pack, and Pl is a weighted value for a location where the first battery pack is replaced with the second battery pack.

10. A charging management method, comprising the following steps:
performing the method according to claim 1; and
correcting, by using the utility value, the charging for replacement of the first battery pack with the second battery pack.

11. A device for estimating a utility of replacement of a battery pack for an electric vehicle, comprising:
a memory configured to store state data associated with a first battery pack and a second battery pack, the state data comprising usage history of the first battery pack and performance parameters of the first battery pack and the second battery pack; and
a processor configured to determine a utility value according to the state data, wherein the utility value is used to characterize a degree of impact of an operation of replacing the first battery pack with the second battery pack on service efficiency and service life of a battery pack set to which the first battery pack and the second battery pack belong,
wherein the performance parameters of the first battery pack and the second battery pack comprise current energy storage values of the first battery pack and the second battery pack and a range factor and a power factor of the second battery pack, the range factor increases as the maximum driving range of the second battery pack increases, the power factor increases as the maximum discharging power of the second battery pack increases, and the utility value increases as a difference between the current energy storage values of the first battery pack and the second battery pack, the range factor, and the power factor increase.

12. The device according to claim 11, wherein the usage history of the first battery pack is a time loss factor and a range loss factor, the time loss factor increases as an accumulated usage time since the first battery pack is put to use for the last time increases, the range loss factor increases as an accumulated driving range since the first battery pack is put to use for the last time increases, and the utility value decreases as the time loss factor and the range loss factor increase.

13. The device according to claim 11, wherein if a condition Max $(E_1, E_2, E_{Average})$–Min $(E_1, E_2, E_{Average})/E_{Average} \geq \lambda$ is satisfied, the processor determines a difference $\Delta E$ between the current energy storage values of the first battery pack and the second battery pack in the following manner:

$$\Delta E = (E_{new} - E_{used})/E_{Average}$$

where $E_1$ is the maximum energy storage value of a new battery pack, $E_2$ is the maximum energy storage value of a used battery pack, $E_{Average}$ is an average value of maximum energy storage values of battery packs in a battery pack set to which the new battery pack and the used battery pack belong, $\lambda$ is a constant that can be experimentally determined, $E_{used}$ is a current energy storage value of the used battery pack, and $E_{new}$ is a current energy storage value of the new battery pack.

14. The device according to claim 11, wherein if a condition Max $(E_1, E_2, E_{Average})$–Min $(E_1, E_2, E_{Average})/E_{Average} < \lambda$ is satisfied, the processor determines a difference $\Delta E$ between the current energy storage values of the first battery pack and the second battery pack in the following manner:

$$\Delta E = SOC_{new} - SOC_{used}$$

where $E_1$ is the maximum energy storage value of a new battery pack, $E_2$ is the maximum energy storage value of a used battery pack, $E_{Average}$ is an average value of maximum energy storage values of battery packs in a battery pack set to which the new battery pack and the used battery pack belong, $\lambda$ is a constant that can be experimentally determined, $SOC_{new}$ is a state of charge (SOC) of the new battery pack, and $SOC_{used}$ is an SOC of the used battery pack.

15. The device according to claim 11, wherein the processor determines a utility value F in the following manner:

$$F = \Delta E \times Fr \times Fp / (Dt \times Dr)$$

where $\Delta E$ is a difference between the current energy storage values of the first battery pack and the second battery pack, Fr is the range factor of the second battery pack, Fp is the power factor of the second battery pack, Dt is a time loss factor of the first battery pack, and Dr is a range loss factor of the first battery pack.

16. A charging management system, comprising:
the device according to claim 11; and
a user management module coupled to the device,
wherein the user management module is configured to correct, by using the utility value, the charging for an operation of replacing the first battery pack with the second battery pack.

17. The charging management system according to claim 16, wherein the user management module is configured to correct the charging for replacement of the first battery pack with the second battery pack in the following manner:

$$Ps = Pb \times F$$

where Pb is a basic amount that needs to be charged or basic points that need to be deducted for replacement of the first battery pack with the second battery pack, and Ps is a corrected value of the basic amount that needs to be charged or the basic points that need to be deducted for replacement of the first battery pack with the second battery pack.

18. The charging management system according to claim 16, wherein the user management module is configured to determine and correct the charging for replacement of the first battery pack with the second battery pack in the following manner:

$$Ps = Pb \times F + Ph + Pl$$

where Pb is a basic amount that needs to be charged or basic points that need to be deducted for replacement of the first battery pack with the second battery pack, Ps is a corrected value of the basic amount that needs to be charged or the basic points that need to be deducted for replacement of the first battery pack with the second battery pack, Ph is a weighted value for human interference by which the first battery pack is replaced with the second battery pack, and Pl is a weighted value for a location where the first battery pack is replaced with the second battery pack.

* * * * *